United States Patent [19]

Ikeda

[11] 3,795,976

[45] Mar. 12, 1974

[54] METHOD OF PRODUCING SEMICONDUCTOR DEVICE

[75] Inventor: Yasuhiko Ikeda, Hitachi, Japan

[73] Assignee: Hitachi, Ltd., Tokyo, Japan

[22] Filed: Oct. 16, 1972

[21] Appl. No.: 297,870

Related U.S. Application Data

[63] Continuation of Ser. No. 32,171, April 27, 1970, abandoned.

[52] U.S. Cl. .......................... 29/580, 29/588, 204/192

[51] Int. Cl. .......................... B01j 17/00

[58] Field of Search ....... 29/580, 583, 588; 204/192

[56] References Cited

UNITED STATES PATENTS

| | | | |
|---|---|---|---|
| 3,247,428 | 4/1966 | Perri | 29/588 |
| 3,257,305 | 6/1966 | Varga | 204/192 |
| 3,410,736 | 11/1968 | Tokuyama | 29/588 |
| 3,491,433 | 1/1970 | Kawamura | 29/570 |
| 3,632,433 | 1/1972 | Tokuyama | 29/588 |

*Primary Examiner*—Roy Lake
*Assistant Examiner*—W. C. Tupman
*Attorney, Agent, or Firm*—Craig and Antonelli

[57] ABSTRACT

A method of producing a semiconductor device provided with a composite passivating film having excellent moisture resistance and a small surface charge density and a small leakage current, which comprises the steps of: contacting a semiconductor wafer heated to a temperature lower than about 700° C. in an atmosphere containing oxygen and a vapor of a volatile organic silicon compound capable of decomposing at a temperature lower than 700° C. in order to deposit silicon dioxide on a free surface of the wafer; forming a tantalum pentoxide film in an oxygen containing atmosphere on the silicon dioxide film by a reactive sputtering of tantalum; and subjecting the wafer to a heat treatment in a non-reducing atmosphere at a temperature of about 200° to about 400° C.

15 Claims, 6 Drawing Figures

INVENTOR
YASUHIKO IKEDA
BY Craig, Antonelli, Stewart & Hill
ATTORNEYS

INVENTOR

YASUHIKO IKEDA

BY

Craig, Antonelli, Stewart & Hill

ATTORNEYS

FIG. 4a
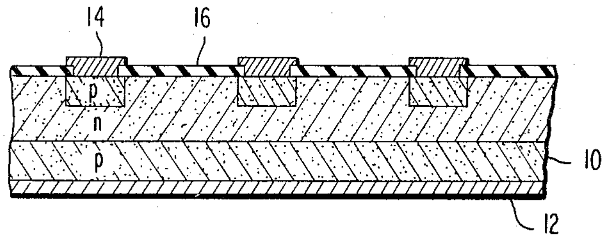
FIG. 4b FIG. 4c
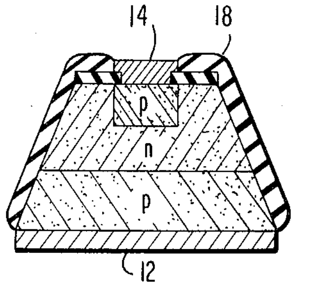
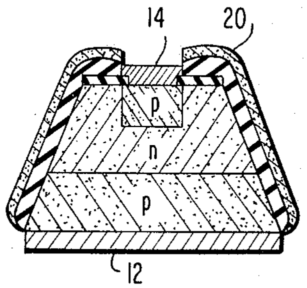

METHOD OF PRODUCING SEMICONDUCTOR DEVICE

This application is a continuation of U.S. application Ser. No. 32,171, filed Apr. 27, 1970 and now abandoned.

BACKGROUND OF THE INVENTION

The present invention relates to a method of producing a semiconductor device having an excellent stable electric characteristic and, more particularly, to an improved method of producing a semiconductor device provided with a composite passivating film having an excellent moisture protecting property.

The electric parameters of semiconductor devices are changed non-reversibly by atmospheric conditions because the activity of the pn-junction surfaces of the devices are affected by these conditions. These surfaces, therefore, have to be isolated from any atmospheric conditions, such as moisture, by a suitable passivating film. There are a large number of processes for producing these passivating films.

Silicon dioxide is a typical passivating film. It is generally formed by thermal oxidation of the surface of a silicon semiconductor device. During the thermal oxidation the gradients of the concentration distribution at the pn-junctions tend to be changed by an undesirable diffusion of impurities, thereby deteriorating or unduly changing the electric properties of the device. Further, severe drawbacks occur when producing many small semiconductor pellets from a single wafer having a large area, each of the pellets having at least one pn-junction exposed to a side face thereof. That is, in the above case, respective ohmic contacts are formed on the respective semiconductor pellets prior to forming the silicon dioxide film and cutting the wafer into the small pellets, from the view point of manufacturing efficiency. Therefore, when a wafer provided with ohmic contacts is subjected to heating for thermal oxidation, an extreme alloying phenomenon between the ohmic contacts and the semiconductor body occurs, so that the electrical properties of the semiconductor pellet should be undesirably changed.

To avoid these undesirable thermal affects during the thermal oxidation, a number of methods for forming the passivating film have been developed which permit passivating film formation at relatively low temperatures.

In one method, the semiconductor wafer is contacted with a vapor containing hydrogen fluoride and nitric acid. However, it is difficult to produce an oxide film of sufficient thickness for a passivating film by this method and, therefore, the film contains a large number of pin-holes.

In another method, a silicon dioxide film is formed on the surface of the wafer by depositing silicon as silicon dioxide. The silicon is generated by the decomposition of a suitable volatile organic silicon compound. Monosilane, $SiH_4$, and disilane, $Si_2H_6$, are volatile organic silicon compounds which decompose at temperatures lower than about 700°C. When these compounds are used, the passivating film can be formed at relatively low temperatures. However, the silicon dioxide film formed by this method is unsatisfactory because of poor moisture resistance, which results in a large leakage current at the junction surface of the device.

SUMMARY OF THE INVENTION

One of the objects of the present invention is to provide a new method of producing a semiconductor device having a passivating film with improved moisture resistance.

Another object of the present invention is to provide a method of producing a passivating film for a semiconductor device which can be formed under conditions having no undesirable thermal affects.

A further object of the invention is to provide a semiconductor device provided with a composite passivating film possessing a small leakage current property.

Other objects and features of the invention will become apparent from the following description, taken in conjunction with the drawings.

The present invention provides a method of producing an improved passivating film for a semiconductor device which comprises the steps of forming ohmic contacts on respective surfaces of semiconductor elements formed in a wafer, cutting the wafer into pellets each corresponding to the element, whereby a pn-junction edge surface of each pellet is exposed to the side surface of the pellet, forming a silicon dioxide film on a free surface of the semiconductor wafer by depositing silicon dioxide generated by chemical decomposition of a volatile organic silicon compound, forming a tantalum pentoxide film on the silicon dioxide film through cathode sputtering of tantalum in an oxygen containing atmosphere, and subjecting the wafer to a heat treatment in order to improve the moisure resistance of the composite film. The present invention also provides a method of producing a semiconductor device in which a silicon dioxide film formed by the chemical decomposition of the organic silicon compound is subjected to a heat treatment, prior to formation of the tantalum pentoxide film which is followed by a heat treatment.

BRIEF DESCRIPTION OF THE DRAWINGS

FIGS. 4*a*–4*c* depict the process for manufacturing semiconductor pellets according to the present invention.

Figure 1:
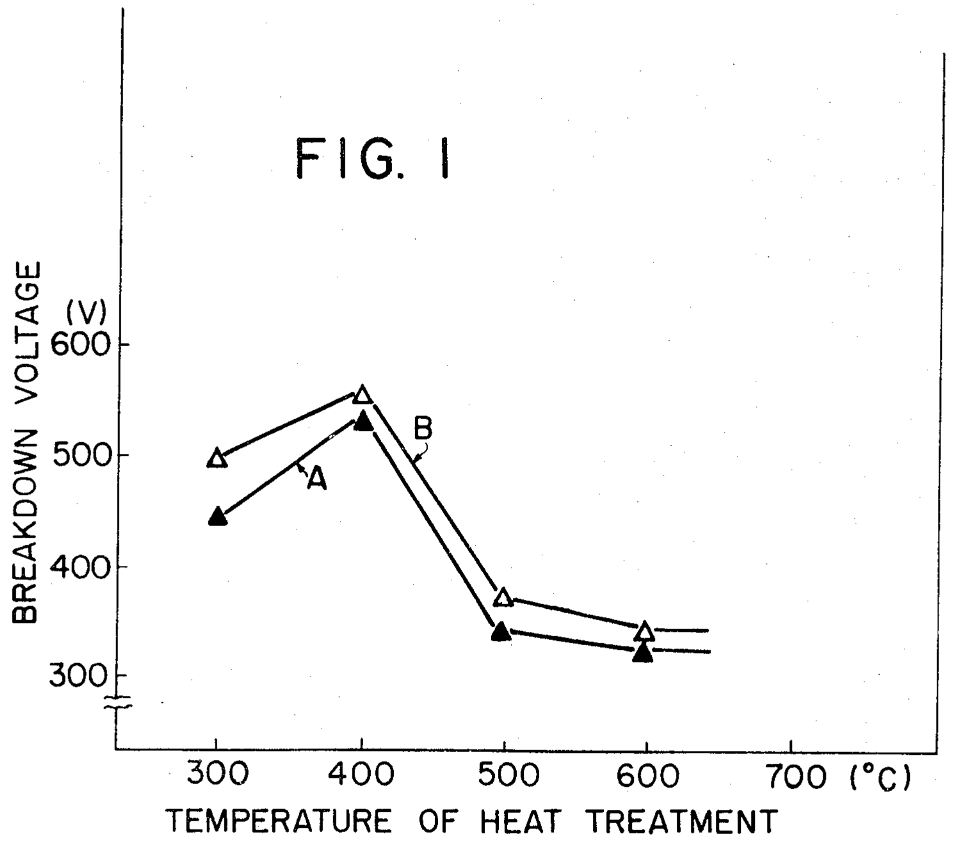
FIG. 1 is a graph showing relationship between breakdown voltages of a semiconductor device according to the present invention and temperatures of heat treatment.

DETAILED DESCRIPTION OF THE EXAMPLES:

As has already been stated, the volatile organic silicon compound to be employed in the invention must have a decomposition temperature lower than about 700°C. If a compound has a decomposition temperature higher than about 700°C , the electric parameters of the devices may be unduly changed by thermal effects during the formation of the silicon dioxide film. Therefore, a silicon compound, decomposable at a low temperature, must be used.

Silicon dioxide is deposited from a vapor containing a silicon compound and an inert carrier gas. When monosilane is employed as the silicon compound, the growth conditions of the films are preferably for a temperature of the wafer of about 300° to 400°C., a vapor flow rate of 5liters per minute and an oxygen flow rate of 0.15 liter per minute, whereby the film can be produced at a rate of about 0.5$\mu$ to 1$\mu$ per minute.

A tantalum pentoxide film is preferably formed under the following conditions. A rod of tantalum is connected to a cathode and a semiconductor wafer provided with a silicon dioxide film is placed on and electrically connected to an anode. The anode and cathode are in a vacuum vessel. Residual gas or water is removed from the vacuum vessel which is evacuated to a pressure of about $10^{-5}$ to $10^{-6}$ mmHg., and then an oxygen-argon gas mixture free from dust and water is charged into the vessel so as to produce a suitable partial pressure of oxygen. A voltage is applied between the cathode and anode and tantalum atoms are sputtered out from the tantalum rod connected to the cathode by striking energized ions towards the wafer biased anode, so that a tantalum pentoxide film is formed on the silicon. The partial pressure of oxygen of about $5 \times 10^{-3}$ to $5 \times 10^{-2}$ torr. is preferable for producing the desired tantalum pentoxide film. When the partial pressure is lower than $5 \times 10^{-3}$ torr., the film may not be completely insulating because of the shortage of oxygen. When the partial pressure is higher than $5 \times 10^{-2}$ torr., a uniform film can not be produced because in such high partial pressure the glow discharge between the electrode is unstable.

Though the films are prescribed as made of silicon dioxide and tantalum pentoxide in the foregoing description, it should be noted that the chemical compositions of the films do not necessarily correspond to the stoichiometric formula $SiO_2$ and $Ta_2O_5$.

It has been found that the formation of a passivating film on the junction surface of a semiconductor device results in an increase of the surface charge density. Silicon dioxide films cause the smallest increase among the films which are practically usable Therefore, it is preferred to use a silicon dioxide film for passivation However, silicon dioxide has poor moisture resistance. Therefore, in the device according to the present invention the film is covered with the tantalum pentoxide film which has excellent moisture resistance. Nevertheless, it has been found that the stability of the devices provided with the composite passivating film comprising a silicon dioxide film and a tantalum pentoxide film have an unsatisfactory passivating property. This results from the fact that the surface charge density caused by the composite film is relatively large resulting in an increased leakage current and a decreased breakdown voltage.

According to our experiment, it was found that the above disadvantages could be eliminated or reduced by employing a suitable heat treatment after the formation of the composite film. That is, by subjecting the device to a heat treatment at a temperature of about 200°C. to 400°C. in a non-reducing atmosphere the surface charge density can be made very small so that the leakage current during forward current blocking operations of the device can be sufficiently reduced. Though the cause of effects of the film and the heat treatment have not been analyzed, it is supposed that by the heat treatment the oxygen vacancies remaining in the silicon oxide film are filled up with oxygen thereby reducing or removing the lattice defects in the silicon dioxide film which cause the increase of surface charge density.

From the above, it will be understood that the devices to be passivated are not subjected to such high temperatures as to deteriorate the electrical characteristics of the devices throughout the formation of the film and the heat treatment. This is very important advantage of the invention.

By experiments, suitable thicknesses of the films have been found. As to the silicon dioxide film the thickness of about 0.4 to 1$\mu$ is suitable. If the thickness is smaller than 0.4$\mu$, pin-holes remain in the film thereby permitting contact between the surface of the wafer and the tantalum pentoxide film causing an increase in the surface charge density. On the other hand, if the thickness is larger than 1$\mu$, cracks form in the film during film formation, heat treatment and the operation of the device because of difference of thermal expansion coefficients of the wafer and the film. If it is possible to produce a film free from pin holes, a thin film can be used because the smaller the thickness of the silicon dioxide film the smaller the surface charge density will become.

The heat treatment is carried out in a non-reducing atmosphere, such as oxygen, oxygen-nitrogen, inert gas, such as, helium and argon, or inert gas -nitrogen gas atmosphere. The atmosphere containing oxygen is most suitable because oxygen contributes to reduce or remove the lattice defects or oxygen-vacancies in the film. On the contrary, a reducing atmosphere containing, for example, hydrogen is not useable because hydrogen increases the oxygen vacancies in the film. Pressures of the atmosphere for the heat treatment are not limited.

The results of our experiments have proved that by forming a phosphate glass layer under the tantalum pentoxide film, semiconductor devices which have very small surface charge density and leakage current characteristics can be obtained. The phosphate glass layer can be formed by depositing phosphorous pentoxide on the silicon dioxide film from an atmosphere containing a vapor of a phosphorous compound, such as, phosphine, $PH_3$, or phosphorous oxychloride, $POCl_3$, or by depositing a mixture of phosphorous pentoxide and silicon dioxide on the free surface of the wafer from an atmosphere containing the volatile organic silicon compound and the phosphorous compound.

Since the phosphorous pentoxide acts as an oxidant for oxidizing the oxygen vacancies in the silicon dioxide, the film becomes stable to moisture so that the device becomes stable. However, the phosphate glass is rich in water absorption and therefore it is necessary to form a tantalum pentoxide film on the phosphate glass layer to protect the device from moisture.

The following experiments are shown for the sake of better understanding of the invention.

EXPERIMENT 1

The effect of thickness of the silicon dioxide film relative to the number of pin-holes is shown below in Table 1.

TABLE 1

| Test No. | Thickness ($\mu$) | Leaked points in the film % |
|---|---|---|
| No. 1 | 0.2 | 90 |
| No. 2 | 0.3 | 40 |
| No. 3 | 0.4 | 16 |
| No. 4 | 0.6 | 15 |
| No. 5 | 1.0 | 15 |
| No. 6 | 0.6–0.7 | 10 |

In this experiment, leaked points where currents which were applied between metallic films formed on the silicon dioxide film and the wafer flowed are the ratio to the whole test points. From the results shown in Table 1, it will be understood that when the thickness is larger than 0.4$\mu$, the number of pin holes in the film is sufficiently small. To make sufficiently small, a thickness larger than 0.4$\mu$ is required.

The result in connection with Test No. 6 in which the silicon dioxide film was formed by thermal oxidation of the wafer at a temperature higher than 1100°C. is shown to compare these films with silicon dioxide film formed by chemical deposition of the organic silicon compound.

EXPERIMENT II

The result of heat crack tests with respect to the silicon dioxide films formed by chemical deposition of the organic silicon compound are shown in Table 2.

TABLE 2

| Thickness ($\mu$) | After film formation | After photo-etching | Heat treatment at ° C. 300 | 400 | 600 | 800 | 1,000 |
|---|---|---|---|---|---|---|---|
| 0.65–0.80 | O | O | O | O | O | O | O |
| 0.80–0.95 | O | O | O | O | O | O | O |
| 1.0–1.2 | O | O | O | O | OX | X | |
| 1.2–1.5 | O | X | ---- | ---- | ---- | ---- | |
| 1.5< | X | ---- | ---- | ---- | ---- | ---- | |

In Table 2, X represents the crack occurrence in the film. From the results in Table 2, the thickness of the silicon dioxide film must be smaller than about 1$\mu$ since heat treatment is required for improving the characteristics of the film. A thickness of smaller than 0.95$\mu$ is preferable.

EXPERIMENT III

The pin hole tests with respect to the tantalum pentoxide film were conducted. In this experiment, the number of pin holes per unit area was calculated by the conversion of the whole number of pin holes in the film. The results are shown in Table 3.

TABLE 3

| Thickness ($\mu$) | The number of pin holes per cm$^2$ |
|---|---|
| 0.1 | 300 |
| 0.2 | 140 |
| 0.3 | 100 |
| 0.4 | 96 |
| 0.5 | 95 |

In general, it is required that the number of pin holes per unit area (cm$^2$) should be less than about 150, from the viewpoint of practical use. From Table 3, it will be understood that the thickness of the tantalum pentoxide film is required to be larger than about 0.2$\mu$ In sputtering the growth speed of the tantalum pentoxide film is about 0.1 to 0.3$\mu$ per hour, therefore, the practical thickness may be about 0.2 to 0.7$\mu$.

EXPERIMENT IV

To determine the effective heat treatment on a thyristor of planar type comprising an n-type emitter layer of 15$\mu$ thickness, a p-type base layer of 20$\mu$ thickness, an n-type base layer of 80 to 100$\mu$ thickness and of 20Ω-cm resistance, and a p-type emitter layer of 40 to 50$\mu$ thickness and a composite passivating film consisting of the silicon dioxide film of 0.8 to 0.9$\mu$ thickness and the tantalum pentoxide film, an experiment was conducted. The specimens were heat treated for 1 to 5 hours at 300° to 600°C.

In FIG. 1, the curve A shows reverse breakdown voltages and curve B shows forward breakdown voltages of the said thyristors. From the results in FIG. 1, though the heat treatment above 300°C. contributes to improve the breakdown voltage, it may not be unfavorable to heat treat the thyristor at temperatures higher than about 400°C. According to another experiment, it has been found that no effect of heat treatment conducted below about 200°C. is expected because of insufficiency of removing the undesirable substances included in the film, such as water. Therefore, the heat treatment should be conducted at about 200° to 400°C.

It is assumed that the heat treatment removes the residual stress in the film, i.e., by the annealing effect of the heat treatment.

EXPERIMENT V

In connection with diodes each having a pn-junction the edge surface of which is exposed at the side surface and having breakdown voltage of 1,500V, another experiment was conducted in order to see effects of heat treatment. The diodes used in this experiment were diodes having no passivating film and diodes having the composite passivating film. The results are shown in Table 4.

TABLE 4

| Specimens | Forward Leakage Current ($\mu$A) at 500V |
|---|---|
| No film | 4.0 |
| No heat treatment | 6.5 |
| After heat treatment at 350°C. for 2 hours in nitrogen atmosphere | 9.1 |
| After heat treatment at 350°C for 2 hours in oxygen atmosphere | 5.0 |

Since no-film diodes are apt to change their electric parameters for a long operation time, the passivating film is necessary even though no-film diodes have the smallest leakage current characteristic.

From the results in Table 4, the heat treatment in the oxygen atmosphere is most suitable for reducing the leakage current. The nitrogen atmosphere, may also be employed because the leakage current is less than 10$\mu$A, however.

EXPERIMENT VI

Figure 2:
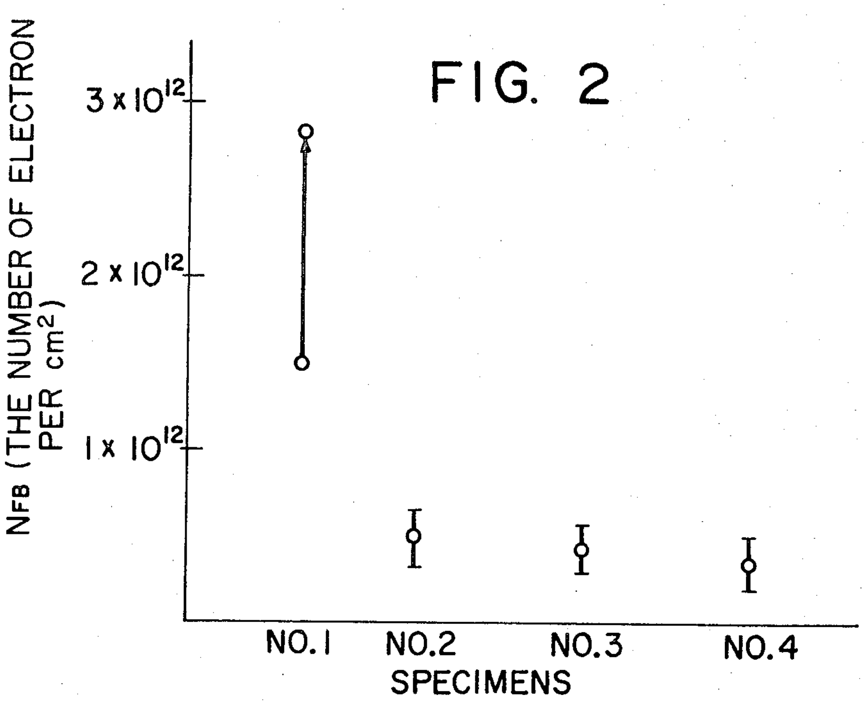
FIG. 2 is a graph showing surface charge densities of devices provided with different passivating films.

FIG. 2 shows a relationship between the kinds of films and the surface charge density $N_{FB}$. In this experiment, the thickness of the silicon dioxide film formed by chemical deposition from silane, $SiH_4$, the organic silicon compound is 0.8 to 0.9$\mu$ and the thickness of the tantalum pentoxide film $Ta_2O_5$ were changed. That is, the specimen Nos. 1, 2, and 3 have 0.2$\mu$, 0.3$\mu$ and 0.45$\mu$ thickness respectively. The heat treatment after formation of $Ta_2O_5$ film through the reactive sputtering was conducted at 300°C. for 5 hours in an oxygen atmosphere. In FIG. 2, the comparison specimen No. 4 is a device having only a silicon dioxide film of 0.8 to 0.9$\mu$ thickness.

From FIG. 2, it will be apparent that $N_{FB}$ can be reduced by employing the composite passivating film and the suitable heat treatment.

In the case of silicon dioxide film formed by thermal oxidation, $N_{FB}$ is considerably larger than that of the device embodying the present invention, despite the superposition of the tantalum pentoxide film on the silicon dioxide film.

Therefore, only the combination of the films and heat treatment of the invention is favorable.

EXPERIMENT VII

By our experiment, it has been discovered that though electric characteristics of the devices having a base resistance of smaller than about 10Ω-cm, which contributes to the breakdown voltage of the device, can be improved only by the heat treatment mentioned above, in case of the devices having a base resistance of larger than about 10Ω-cm a preheat treatment in connection with the silicon dioxide film also improves these characteristics. The preheat treatment is conducted prior to the formation of the tantalum pentoxide film, at relatively high temperature such as 500° to 900°C. for a period of about 1 to about 30 minutes.

Although in the device having the small base resistivity, influence of $N_{FB}$ on the leakage current is not so remarkable, in the device having the relatively large base resistivity the preheat treatment of the silicon dioxide is useful for removing or reducing the oxygen vacancies in the film. This preheat treatment is conducted at about 500°C. to about 900°C. for a short period, such as for example, 3 to 5 minutes, in order to avoid the undesirable affect to the electric properties of the device and the occurrence of cracks in the film.

According to our experiment it has been discovered that the preheat treatment should be carried out in an inert gas atmosphere such as argon or helium. A nitrogen atmosphere does not bring about any advantage for increasing the electric characteristics of the device. An oxygen atmosphere is unsatisfactory because the silicon under the silicon dioxide film is oxidized. However, it should be noted that the preheat treatment can be omitted even when the devices have a base resistance of larger than 10Ω-cm.

After the preheat treatment, the tantalum pentoxide film is formed on the silicon dioxide film by reactive sputtering. The composite passivating film thus obtained is subjected to the heat treatment at 200°C. to 400°C.

Figure 3:
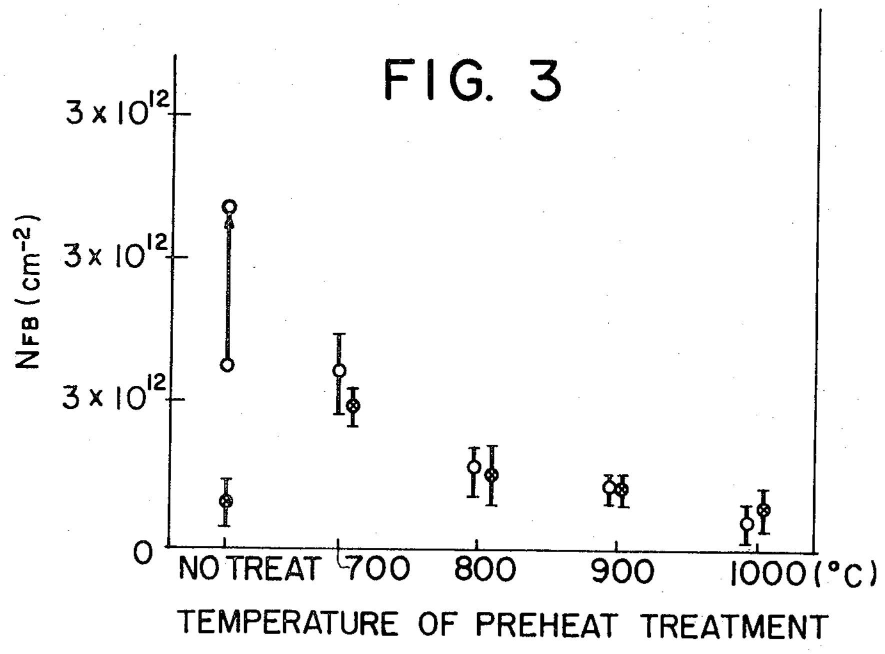
FIG. 3 is a graph showing surface charge densities of devices provided with different passivating films.

FIG. 3 shows a relationship between the kinds of the passivating film and the surfaee charge density $N_{FB}$, in which O represents the results of the device having the silicon dioxide film formed by the chemical deposition from vapor of the organic silicon compound and⊗ represents the results of devices having the composite passivating film, which is produced by the process comprising the steps of: forming the silicon dioxide film by chemical deposition on the wafer; subjecting the wafer to a preheat treatment at temperatures shown in FIG. 3, in an argon atmosphere for 5 minutes; forming the tantalum pentoxide film by reactive sputtering on the silicon dioxide film; and subjecting the wafer to the heat treatment at 300°C. in an oxygen atmosphere. The thickness of the silicon dioxide film and the tantalum pentoxide film are 0.8 to 0.9μ to 0.3μ, respectively, From FIG. 3, it can be seen that the preheat treatment is useful for reducing $N_{FB}$ of the device so that the breakdown voltage of the device can be increased. According to the process including the preheat treatment for the silicon dioxide film, devices having high breakdown voltages compared with devices manufactured, by a process including only the heat treatment can be manufactured.

It should be noted that the present invention will be applicable to diodes, transistors, thyristors and the like.

In the above experiments the devices were manufactured in accordance with the process shown in FIGS. 4a to 4c. In the silicon wafer 10, a large number of semiconductor elements, such as transistors, as shown, are formed by a suitable manner such as a diffusion method. After the semiconductor elements are formed, ohmic contacts 14 are formed by, such as, metal evaporation through respective openings formed in the silicon dioxide film 16. Since the semiconductor elements have a small size, it is very difficult to form an ohmic contact after the semiconductor wafer is cut into small pellets. Therefore, it is necessary to form the ohmic contacts before the wafer is cut into pellets.

After ohmic contacts 14 and electrode 12 are formed, the wafer is cut into the pellets each having a predetermined size, whereby an edge surface of a pn-junction is exposed to a side surface, as shown in FIG. 4b. The free surface, including the edge surface, is then coated with a silicon dioxide film 18 formed by a chemical vapor deposition method. Since the formation of the silicon dioxide film is formed at relatively low temperatures at which the ohmic contacts is not affected by heat, there is no undesirable change of electric properties of the device. After the silicon dioxide film is formed, the pellet is then placed in a sputtering apparatus, so as to form the tantalum pentoxide film 20 as shown in FIG. 4c. The present invention is, of course, applied to manufacturing of diodes which comprise P— and N—layers or P±, P— and N—layers, each pn junction being exposed to the side surface of the pellet.

As having described above, according to the present invention, the passivating treatment of a small size semiconductor device can be effectively performed at low temperatures so that adverse effects on the semiconductor devices do not occur.

I claim:

1. A method of producing a semiconductor device which comprises the steps of:

preparing a semiconductor wafer comprising a plurality of semiconductor elements formed therein, each of said elements having the same configuration and at least one pn-junction, the edge surface of which does not extend to the plane surface of the wafer;

forming an ohmic contact on each plane surface of said semiconductor elements and an electrode on a surface opposite to said plane surface;

cutting said afer into pellets, each corresponding to said semiconductor element and having a predetermined size, whereby said edge surface of the pn-junction is exposed to the side surface of each pellet;

placing each of said pellets in an atmosphere containing a vapor of a volatile organic silicon compound which decomposes at a temperature lower than about 700°C;

heating said pellets to a temperature of less than about 700°C at which said silicon compound decomposes, thereby depositing a silicon dioxide film on a free surface of the pellets;

forming a tantalum pentoxide film on the silicon oxide film by reactive sputtering of tantalum in an oxygen atmosphere; and then heat treating said wafer at 200° to 400°C in a non-reducing atmosphere, whereby oxygen vacancies in said films are reduced, to render the surface charge density $N_{FB}$ small on said free surface.

2. A method according to claim 1, wherein said non-reducing atmosphere contains oxygen, nitrogen, an inert gas, or mixtures thereof.

3. A method according to claim 2, wherein said inert gas is helium or argon.

4. A method according to claim 1, wherein said silicon dioxide film is deposited to a thickness of less than about $1\mu$.

5. A method according to claim 4, wherein said silicon dioxide film is deposited to a thickness of between about $0.4\mu$ to about $1\mu$.

6. A method according to claim 5, wherein said silicon dioxide film has a thickness of from about $0.4\mu$ to about $0.95\mu$.

7. A method according to claim 1, wherein the sputtering of tantalum pentoxide is continued until the thickness of the tantalum pentoxide film is at least $0.2\mu$.

8. A method according to claim 1, wherein the sputtering of tantalum pentoxide is continued until the thickness of the tantalum pentoxide film is from about $0.2\mu$ to about $0.7\mu$.

9. A method according to claim 1, wherein the silicon compound is monosilane, disilane or mixtures thereof.

10. A method according to claim 1, further comprising the step of forming a phosphorous glass layer consisting of a mixture of silicon dioxide and phosphorous pentoxide prior to the step of forming the tantalum pentoxide film, said tantalum pentoxide film being formed on said phosphorous glass layer.

11. A method according to claim 10, wherein said phosphorous glass layer is formed by depositing phosphorous pentoxide on said silicon oxide film.

12. A method according to claim 11, wherein said phosphorous pentoxide is deposited from an atmosphere containing $PH_3$ or $POCl_3$.

13. A method according to claim 10, wherein said phosphorous glass layer is formed by depositing a mixture of phosphorous pentoxide and silicon dioxide on said wafer from an atmosphere containing said silicon compound and $PH_3$ or $POCl_3$.

14. A method according to claim 1, wherein said silicon dioxide film is heat treated at a temperature of from about 700°C. to about 900°C. prior to the formation of the tantalum pentoxide film.

15. A method according to claim 10, wherein said phosphorous glass layer is heat treated at a temperature of from about 700°C. to about 900°C. prior to the formation of the tantalum pentoxide film.

* * * * *